United States Patent [19]

Taylor et al.

[11] Patent Number: 4,818,661

[45] Date of Patent: Apr. 4, 1989

[54] METHOD FOR FABRICATING THIN FILM METALLIC MESHES FOR USE AS FABRY-PEROT INTERFEROMETER ELEMENTS, FILTERS AND OTHER DEVICES

[75] Inventors: Charles J. Taylor, Catonsville; Julius Grossman, Randallstown; Jacqueline Fischer, Silver Spring; Howard A. Smith, Chevy Chase; Martin C. Peckerar, Silver Spring; Milton L. Rebbert, Elkridge, all of Md.

[73] Assignee: The United States of America as represented by the Secretary of the Navy, Washington, D.C.

[21] Appl. No.: 79,962

[22] Filed: Jul. 21, 1987

[51] Int. Cl.[4] ............................................. G03C 5/00
[52] U.S. Cl. ..................................... 430/320; 430/321; 430/323; 430/324; 204/15
[58] Field of Search ......................... 430/314, 315, 4, 6, 430/321, 323, 324, 320, 329; 204/15

[56] References Cited

U.S. PATENT DOCUMENTS

| | | | |
|---|---|---|---|
| 2,961,746 | 11/1960 | Lyman | 430/314 XR |
| 3,953,303 | 4/1976 | Kamada et al. | 204/15 |
| 4,118,288 | 10/1978 | Ruckl | 204/11 |

FOREIGN PATENT DOCUMENTS 2150596  7/1985  United Kingdom ................ 430/314

Primary Examiner—Jose G. Dees
Attorney, Agent, or Firm—Thomas E. McDonnell; George Jameson

[57] ABSTRACT

A method of fabricating a free-standing wire mesh grid pattern having a smooth, flat surface is disclosed. A thermal oxide is selectively applied to front and back sides of a silicon substrate. A central portion of the oxide on the back side is removed. A resist layer is applied onto the oxide on the front side of the substrate. A resist mesh pattern with a border encompassing that resist mesh pattern is lithographically developed on the resist layer. Chrome and gold layers are sequentially deposited onto the border and into the resist mesh pattern to create a wire mesh pattern within the resist mesh pattern. The resist layer, including the developed resist mesh pattern, is removed to expose the wire mesh pattern from the front side of the substrate. A nickel layer is deposited over the gold layer to develop a wider wire mesh pattern. A second gold layer is then deposited over the nickel layer to form a wire mesh grid pattern composed of chrome, gold, nickel and gold layers.

5 Claims, 5 Drawing Sheets

METHOD FOR FABRICATING THIN FILM METALLIC MESHES FOR USE AS FABRY-PEROT INTERFEROMETER ELEMENTS, FILTERS AND OTHER DEVICES

BACKGROUND OF THE INVENTION

1. Field of the Invention

The present invention relates to a method for fabricating Fabry-Perot interferometer elements (etalons) and more particularly to a photolithographic method for fabricating very flat, polished and highly uniform, free-standing metallic meshes. Such metallic meshes may be utilized, for example, as elements in Fabry-Perot or Michelson interferometers, as filters to filter radiation, liquids or particles, as optical/infrared reflectors, as optical/infrared beam splitters or dichroics, as optical polarizers and in other like devices.

2. Description of the Prior Art

Metal films on dielectric coatings are able to provide high reflectivity surfaces, but in the infrared spectral region they have fundamental absorption losses of several percent which can limit their usefulness in associated systems. One such system is a Fabry-Perot interferometer, in which the radiation reflects tens or hundreds of times from the surfaces, suffering absorption losses at each pass. In the far-infrared portion of the spectrum, beyond about 30 microns, the limitations of metal films can be overcome by using metal meshes which resonantly reflect the radiation with losses of less than 1%. However, fabrication of such metal meshes, especially free-standing meshes, has been difficult.

For proper operational use in Fabry-Perot interferometers, such metal meshes should meet the following requirements. They must be made to specific, uniform and exacting tolerances, as specified by the theory which models wire widths, periodicity and thickness. The squareness of the holes and the steepness of the sides appear to be additional important parameters. At far-infrared wavelengths, the metal meshes must be mechanically strong so that they will not tear or stretch with mounting or handling, and this mounting must be capable of pulling the mesh very flat to achieve high "flatness finesse". The root-mean-square (rms) surface roughness of the reflecting surface of the mesh must be low (e.g. less than about 300 angstroms (Å)) for high transmission. The mesh surfaces must be capable of having a gold or copper coating on all of their areas for high electrical conductivity, which parameter helps provide low absorption. The metal meshes must be made in a clean environment or be capable of a thorough cleaning so that the radiation sees few impurities. Finally, the metal meshes also must withstand cryogenic temperatures.

Unfortunately, the prior art metal meshes do not meet all of the above described requirements.

One presently used method for fabricating metal meshes involves the etching of bi-metallic layers. In this first type, two layers of metal are electroformed on a block which can be removed after the mesh is formed. The top metal in the bi-metal block is patterned by some lithographic technique. Then the block is removed and the bottom metal, which operates as a support metal for the top metal, is selectively etched in some regions to provide a free-standing grid or mesh of the top metal. The surface of the patterned top metal is usually very rough. Therefore, a mesh made with such a patterned top metal would be unsuitable for use as a Fabry-Perot interferometer element. On the other hand, the surface of the bottom metal that is in contact with the block can be made smooth. However, the bottom metal is too thick to be patterned with good dimensional control.

Another presently used method for fabricating metal meshes is by using a ruling engine for pattern formation. Such a fabricated metal mesh tends to be irregular in shape. More importantly, the finished pattern of this fabricated metal mesh is usually very rough and non-uniform, which degrades both the transmission and the resolution of the Fabry-Perot interferometer metal mesh element or etalon.

OBJECTS OF THE INVENTION

Accordingly, one object o this invention is to provide a method for fabricating thin film metallic meshes suitable for use as Fabry-Perot interferometer elements, filters and other devices.

Another object of this invention is to provide a method for fabricating very flat and highly uniform metallic free-standing patterned membranes or meshes.

A further object of this invention is to provide a method which utilizes photographic and microelectronic techniques to transfer a preselected pattern into a three-dimensional structure.

SUMMARY OF THE INVENTION

These and other objects of this invention are achieved in a preferred method of the invention by lithographically developing a mesh pattern of lines and an annular border therearound onto a resist deposited on a silicon substrate, sequentially depositing a layer of chrome and a layer of gold onto the mesh pattern before washing off the resist, depositing or electro-plating a layer of nickel onto the chrome-gold mesh pattern, etching away the silicon substrate leaving a free-standing metal mesh supported by the annular border or annular remnant of the silicon substrate, removing oxides from the mesh pattern before removing the chrome layer on the chrome-gold mesh, and finally depositing a layer of gold on the mesh pattern to obtain a single, highly reflective metal surface on the mesh pattern.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENT

Figure 1:
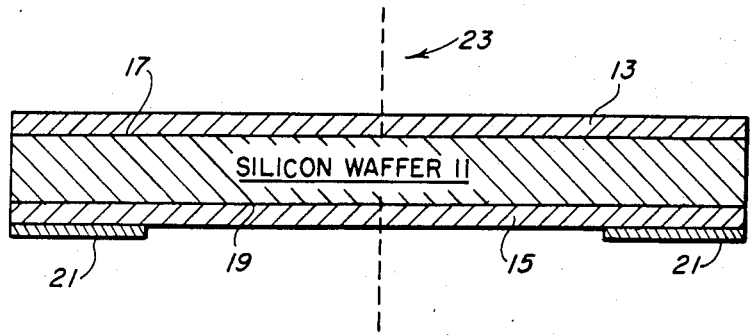
FIG. 1 is a sectional side view showing relatively thick oxide layers on the upper and lower surfaces of a silicon wafer, and an annular resist layer disposed around the periphery of the lower oxide layer.

Referring now to the drawings, the method for fabricating free-standing or self-supporting, thin-film, membranes or metallic meshes suitable for use as Fabry-Perot interferometer elements, filters and other devices involves the following operational steps.

Preparing Wafer

As shown in FIG. 1, a silicon wafer 11 was chosen for a substrate because of its very smooth and flat surface. The silicon wafer 11 selected was 2 inches in diameter and 100 microns thick. It should, however, be realized that any other dielectric material of a desired suitable size and configuration could have been selected as a substrate, provided that it had a very smooth and flat surface.

Six thousand angstrom thick silicon dioxide layers 13 and 15 were respectively grown on the upper and lower surfaces 17 and 19 of the wafer 11. Then the wafer 11 was placed, with its lower surface 19 up, on a vacuum chuck spinner (not shown) and rotated at 1000 revolutions per minute (rpm). An artist's brush (not shown) dipped in photoresist was then used to paint an annular photoresist layer 21 on the periphery of the surface of the oxide layer 15 from ⅜ inch from the axial center 23 of the wafer 11 on out.

Figure 2:
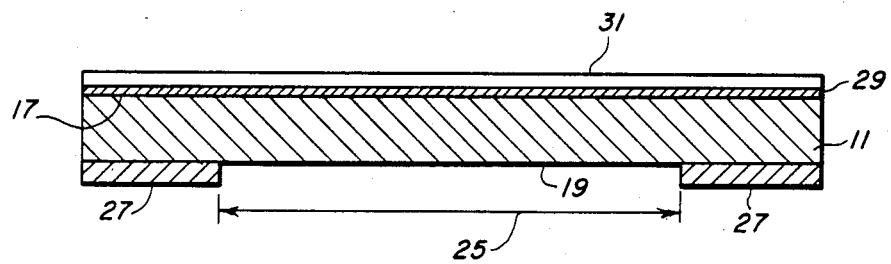
FIG. 2 shows the structure of FIG. 1 with a centrally-etched-away lower oxide layer, which is minus the resist layer, and a new relatively thin oxide layer and a resist layer on its upper surface.

Referring now to FIG. 2, the structure shown in FIG. 1 was next baked in a dry air ambient oven at 90 degrees centigrade (90° C.) for 30 minutes. All of the oxide layer 13 (FIG. 1) on the upper surface 17 was etched away and a hole 25 of approximately 1.25 inches in diameter was etched into the oxide layer 15 by means of a buffered hydrofluoric acid. The annular resist layer 21 (FIG. 1) was removed, leaving an annular border 27 of silicon dioxide around the lower surface 19 of the wafer 11. A relatively thin 200 angstrom silicon dioxide layer 29 was grown on the upper surface 17 of the wafer 11 for purposes of adhesion (to be explained).

Coating Upper Oxide Layer With Photoresist

A five percent (5%) solution of hexamethyldisilane (HMDS) in xylene was flood-coated on the silicon dioxide layer 29 of the wafer of FIG. 2 and then the HMDS coated wafer was spun at 5000 rpm for 30 seconds for adhesion promotion in later operations. After being spun for 30 seconds the HMDS coated wafer was immediately flood-coated with a layer 31 of a suitable photoresist and spun at 5000 rpm for 30 seconds. The photoresist used could be, for example, the photoresist manufactured by KTI Chemicals, Inc., Sunnyvale, CA, and having part number 820-27. Finally the photoresist coated wafer of FIG. 2 was placed on a plastic tray (not shown) and put into a forced air oven at 90° C. for 30 minutes to dry the photoresist layer 31.

Exposing A Desired Pattern On The Photoresist Layer

A suitable contact printer (not shown) (such as a contact printer manufactured by Karl Suss of America, Inc., Waterbury Center, Vermont, and having part or model number MJB-3) was used to expose the photoresist layer 31. While contact printing is utilized in this discussion, it should be understood that any other form of suitable high-resolution lithography, such as projection printing, could be used. The contact printer was set for an exposure of light having a wavelength of 320 nanometers (nm) and an energy level of 15 milliwatts per square centimeter (15 mw/cm$^2$) in energy density. A chrome photoplate or mask (not shown) with the desired pattern was inserted into the contact printer. The wafer of FIG. 2 was then placed on a platform (not shown) of the contact printer and brought into vacuum contact with the photoplate. Finally, the photoresist layer 31 on the upper part of the wafer of FIG. 2 was exposed to the preselected light from the contact printer for 10 seconds to depolymerize the photoresist layer 31.

Developing The Exposed Photoresist Layer

A suitable developer (not shown) was then sprayed from a suitable spray gun (not shown) onto the exposed photoresist layer 31 (FIG. 2) for 30 seconds to develop the exposed layer 31. The developer used could be, for example, a 1 to 1 mixture of de-ionized water and a type 934 resist developer manufactured by Eastman Kodak Co., Rochester, N.Y. The spray gun used could be a type VL-3 manufactured by Paasche Air Brush Co., Chicago, IL.

Immediately after being sprayed, the exposed and developed photoresist layer 31 was rinsed with a de-ionized water rinse sufficient to raise the water resistivity above 4 megohms. Then the wafer was blown dry with dry nitrogen, resulting in the wafer shown in FIGS. 3 and 4.

Figure 3:
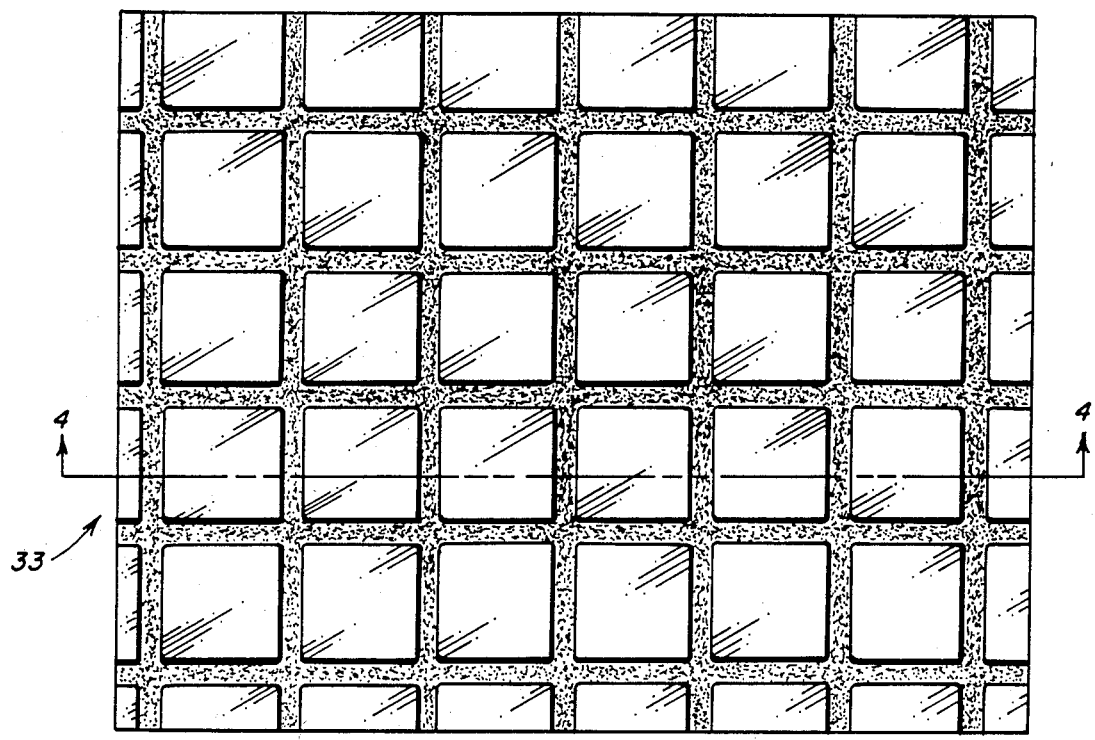
FIG. 3 is a top view illustrating a photoresist pattern on the upper surface of the silicon wafer of FIG. 2.

FIG. 3 shows a resist pattern of lines or a grid pattern 33 that was lithographically developed in the photoresist layer 31 (FIG. 2) on the upper surface 17 of the silicon wafer 11. A typical pattern, or mesh pattern, would have lines developed out of the photoresist, or resist, two micrometers wide on seventeen micrometer centers over an area of a three centimeter diameter.

Figure 4:
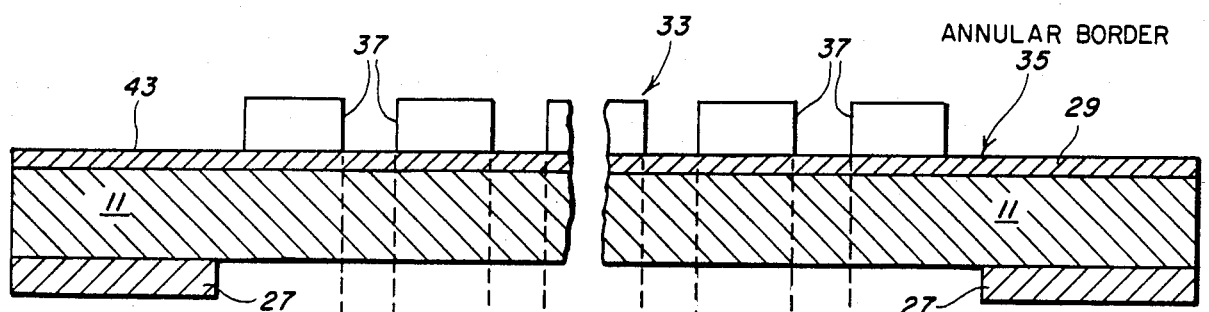
FIG. 4 is a sectional side view showing the photoresist pattern of FIG. 3 on the upper surface of the silicon wafer being surrounded by an annular border.

FIG. 4 is a sectional side view of the resist pattern of lines or grid pattern 33 taken along the sectional line 4—4 of FIG. 3. In addition to the grid pattern 33, an annular border 35 around the grid pattern 33 was also developed out of the photoresist. This annular border 35 is approximately one centimeter wide around the grid pattern 33. As indicated in FIG. 4, the photoresist selected was one that had vertical sides 37 when developed.

Evaporating Metals Onto The Resist Pattern

Figure 4A:
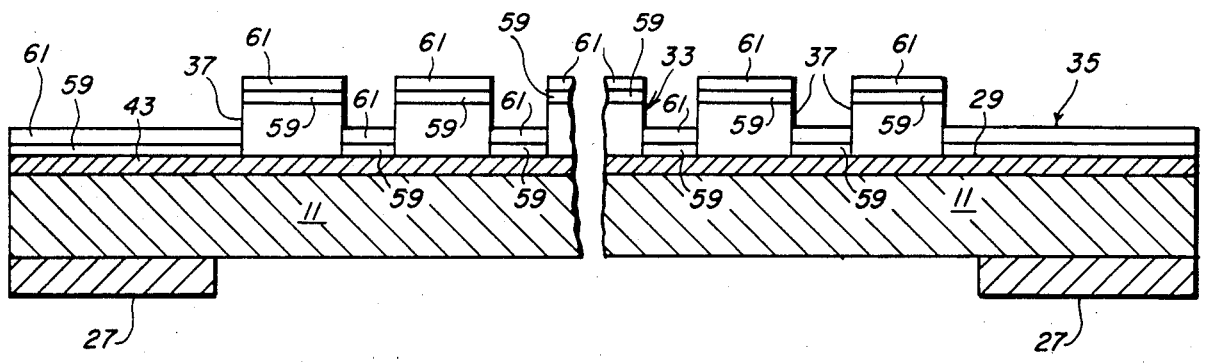
FIG. 4A shows the chrome and gold layers deposited on the upper surfaces of the exposed resist layer and oxide layer of FIG. 4.

Referring now to FIG. 4A, the wafer of FIG. 4 was placed in a metal evaporator without having the resist pattern baked out. Fifty angstroms of chrome (Cr) were evaporated or deposited over the face of the patterned silicon wafer of FIG. 4 to form a chrome layer 59 in the resist or mesh pattern 33 (FIG. 4) and to cover the annular border 35 (FIG. 4). This chrome layer 59 was deposited on the silicon wafer of FIG. 4 in order to form a good adhesive base for 300 angstroms of gold (Au) that were subsequently deposited over the chrome to form a gold layer 61 over the chrome layer 59. Since the photoresist layer 31 (FIG. 2) was selected to have vertical sides 37 when developed, only negligible amounts of chrome and gold become deposited on the vertical sides 37 of the developed resist layer 31. Thus, the chrome-gold (Cr-Au) layers 59, 61 were sequentially deposited into the resist pattern 33 (FIG. 4) on the silicon dioxide layer 29 and over that portion 43 of the silicon dioxide layer 29 forming the ⅜ inch annular border 35 around the resist pattern 33.

It should be noted at this time that the thin silicon dioxide layer 29 not only provided an adhesive surface for the resist pattern 33 but also provided adhesion to the chrome that was deposited.

While in the evaporator the wafer of FIG. 4A was spaced 30 cm from the chrome and gold sources (not shown) to minimize the heat at the wafer, since excessive heat would harden the resist and prevent its subsequent removal.

Figure 5:
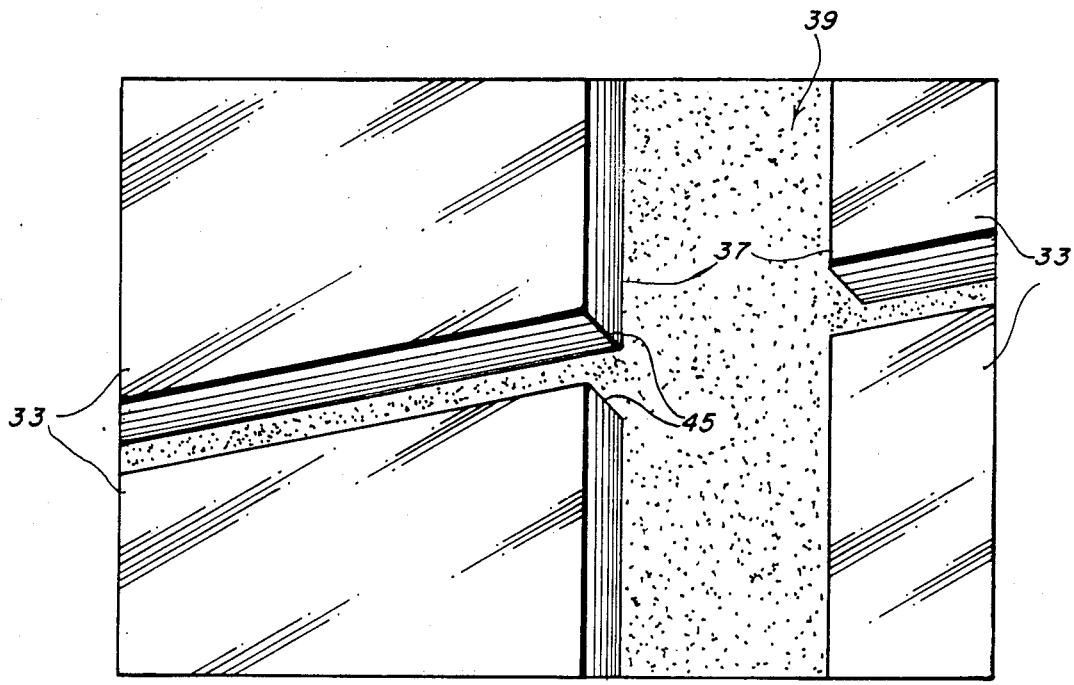
FIG. 5 shows an enlargement of part of the pattern of FIG. 3 after layers of chrome and gold have been sequentially deposited thereon.

FIG. 5 shows an enlargement of part of the resist pattern 33 of FIG. 3 (and FIG. 4) after the layers of chrome and gold have been sequentially deposited into the resist pattern 33 to form a Cr-Au layered pattern 39 within the resist pattern 33. This Cr-Au pattern 39 is effectively the negative of the resist pattern 33.

As stated before, the photoresist 31 selected was one that would have vertical sides 37 when the photoresist was developed. Note the straightness of the sides 37 and the squareness of corners 45 of the resist pattern 33. The sides 37A (FIG. 6) of the Cr-Au pattern 39 will be just as straight as the sides 37 of the resist pattern 33 (FIG. 5). Similarly, the corners 45A (FIG. 6) of the pattern 39 will be at least as square as the corners 45 of the resist pattern 33 (FIG. 5). These are important and unique properties in this process.

Removing The Resist

The wafer of FIG. 5, containing the Cr-Au layered pattern 39 was placed in a covered beaker of acetone (a resist solvent) for one minute at 30° C. Then the wafer was placed in a suitable ultrasonic bath and ultrasonically vibrated in a bath of acetone for several minutes to remove the resist pattern 33, leaving the Cr-Au grid pattern 39 on the wafer of FIG. 5. The ⅜ inch annular border 35 retained the Cr-Au coating thereon.

Figure 6:
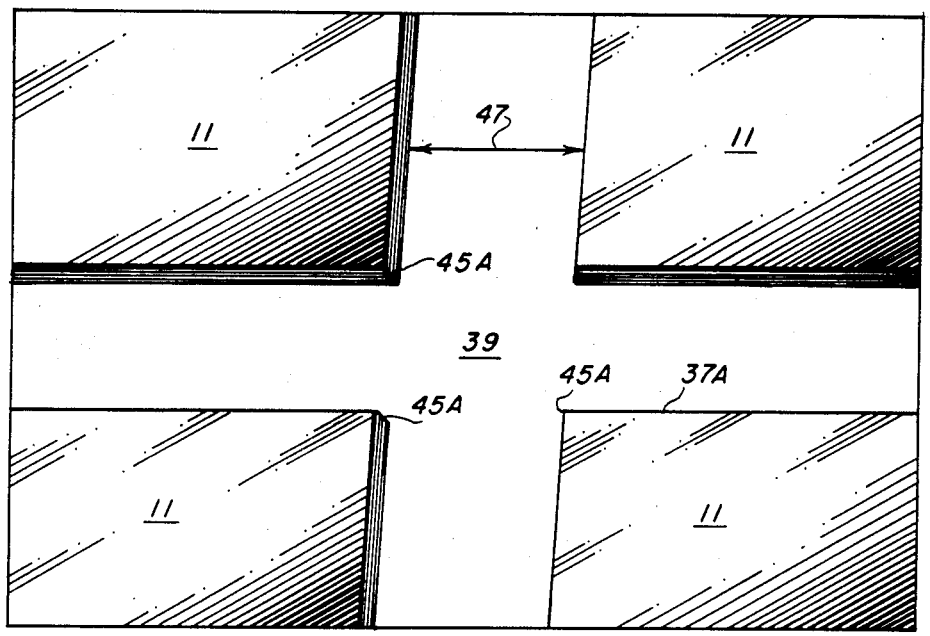
FIG. 6 is a top view showing the chrome-gold pattern that remains on the silicon wafer after the photoresist is removed from the upper surface.

FIG. 6 illustrates the Cr-Au pattern 39 of FIG. 5 after the resist 31 (FIG. 2) was removed. Note that only the Cr-Au grid pattern 39 along with the Cr-Au layers (not shown) on the annular border 35 (FIG. 4) remain on the silicon wafer 11 after the resist pattern 33 is removed. The remaining Cr-Au forms an electrically continuous orthogonal grid pattern, with the Cr-Au coated annular border (not shown) forming an electrical path that can be easily connected to a power supply (not shown).

The Cr-Au patterned wafer of FIG. 6 was further cleaned of any photoresist residue, without adversely effecting the chrome-gold adhesion, by soaking it in a piranha solution of 80% sulfuric acid ($H_2SO_4$) and 20% hydrogen peroxide ($H_2O_2$) for about five minutes before rinsing it in de-ionized water. This assures that the wafer of FIG. 6 will have a smooth surface.

Plating The Chrome-Gold Pattern With Nickel

Figure 7:
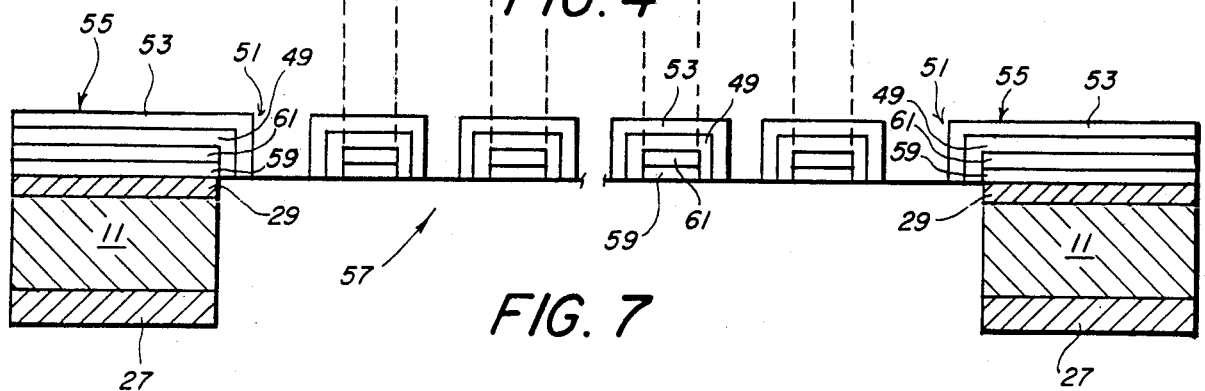
FIG. 7 shows a sectional side view after a nickel layer has been deposited over the gold layer of FIG. 6 and the surrounding annular border (FIG. 4), and after an annular inner portion of the silicon wafer has been removed.

While the cleaned wafer of FIG. 6 was still wet, an electrical connection was made to the Cr-Au plated wafer of FIG. 7. The wafer was then placed into a plating bath. The gold layer of the chrome-gold layers was electrically plated with a nickel layer 49 to increase the grid thickness (not shown) to 2.5 micrometers (variable and set by theory) and to build the linewidth 47 of the Cr-Au grid pattern 39 of FIG. 6 to 6 micrometers(variable and set by theory). To accomplish this nickel plating operation, the wafer of FIG. 6 was electroplated for 33 minutes in a 50° C. bath of nickel sulfamate bath plating solution at a current of 80 milliamperes (ma). These parameters will vary as a function of changes in the preceding parameters (grid thickness and line width). Such a bath plating solution was used to maintain a smooth surface on top of the Cr-Au mesh pattern 39 (FIG. 6) and, at the same time, provide the ductility needed to subsequently mount the final mesh pattern into an etalon of a Fabry-Perot interferometer. Other nickel baths can be used to plate nickel with a higher tensile strength.

The area of nickel plating was approximately 2.2 inches square. A ⅜ inch border around the Cr-Au pattern 39 was used to make electrical contact to the plating area. Four contacts (not shown) clipped to four places around the plating area assured current uniformity and, hence, provided a more uniform plating thickness across the Cr-Au pattern 39.

FIG. 7 shows the wafer of FIG. 4A after the resist pattern 33 has been removed (along with the chrome and gold layers 59 and 61 on top of that resist pattern 33) and after the nickel layer 49 has been deposited over the gold layer of the Cr-Au mesh 39 of FIG. 6 and over the surrounding Cr-Au annular border 35 (FIG. 4A). Thus, the mesh pattern 39 of FIG. 6 now becomes a Cr-Au-Ni mesh pattern, and the annular border 35 (FIG. 4A) becomes an annular Cr-Au-Ni border 51, comprised of the respective chrome, gold and nickel layers 59, 61 and 49.

Clading The Nickel Plated Wafer with Gold

Immediately after the wafer of FIG. 7 was plated with nickel, the exposed surface of the nickel layer 49 was rinsed and then electroplated in a gold plating bath to form a gold layer 53 of 300 angstroms in thickness over the nickel. This gold layer 53 is used to protect the surface and improve the electrical conductivity of the resultant grid or mesh pattern formed by the Ni-Au layers on top of the Cr-Au pattern 39 of FIG. 6.

Removing The Backing From The Mesh Pattern

If any residual oxides were on the back of the wafer, as shown in FIG. 4, they would be removed by swabing the back surface of the silicon wafer 11 within the annular border 27 with a 10% solution of hydrofloric acid (HF).

The backing of the silicon wafer 11 (FIG. 4) within the annular border 27 was removed by placing the wafer in a solution of 65% hydrazine, 35% water at 60° C. for 20 minutes. This hydrazine etched the silicon 11 up to the silicon dioxide layer 29, without etching the layer 29. The hydrazine etching had to be done under a hood, since hydrazine evolves poisonous gasses and must be handled with caution.

The backing of silicon dioxide 29 (FIG. 4) under the Cr-Au-Ni-Au mesh pattern (of FIG. 7) was removed by next transferring the wafer to a solution of 50 grams (gr.) of potassium hydroxide (KOH) and 150 milliliters (ml) of water at 70° C. The potasium hydroxide etched out the backing of silicon dioxide 29 under the mesh pattern to produce the wafer shown in FIG. 7.

Since the Cr-Au-Ni-Au border (comprised of Cr-Au layers 59 and 61 and the nickel and gold layers 49, 53 above layers 59 and 61) protected the silicon 11 from being etched from the top of the wafer of FIG. 7 and the 6000 angstrom, silicon dioxide annular border 27 protected the composite annular border 55 (comprised of 27, 11, 29, 59, 61, 49, 53) from being etched from the back of the wafer of FIG. 7, the silicon 11 between those layers provides a support for the frail grid pattern 57 within the annular border 55.

Etching The Chrome Layer

The wafer of FIG. 7 was dipped into a solution formed from saturated potassium ferricyanide and 700 cc of water and 6 tablets of potassium hydroxide at 65° C. for 15 seconds in order to remove the 50 angstrom layer of chrome 59 from the 300 angstrom layer of gold 61 previously deposited. This produces a cleaner front surface.

Figure 9A:
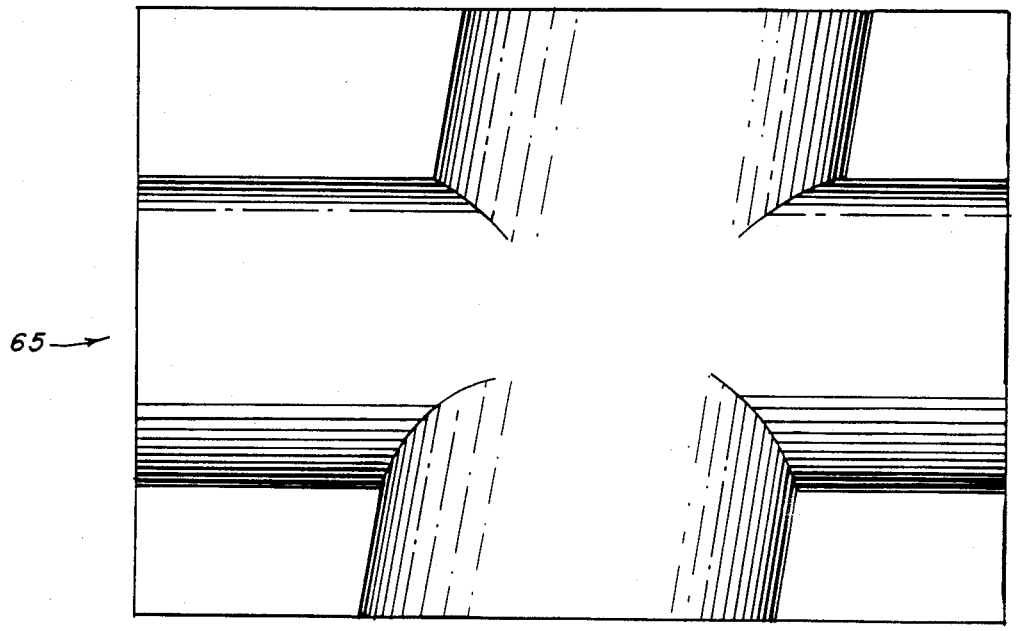
FIG. 9A shows an enlargement of part of the back surface shown in FIG. 9.
Figure 8:
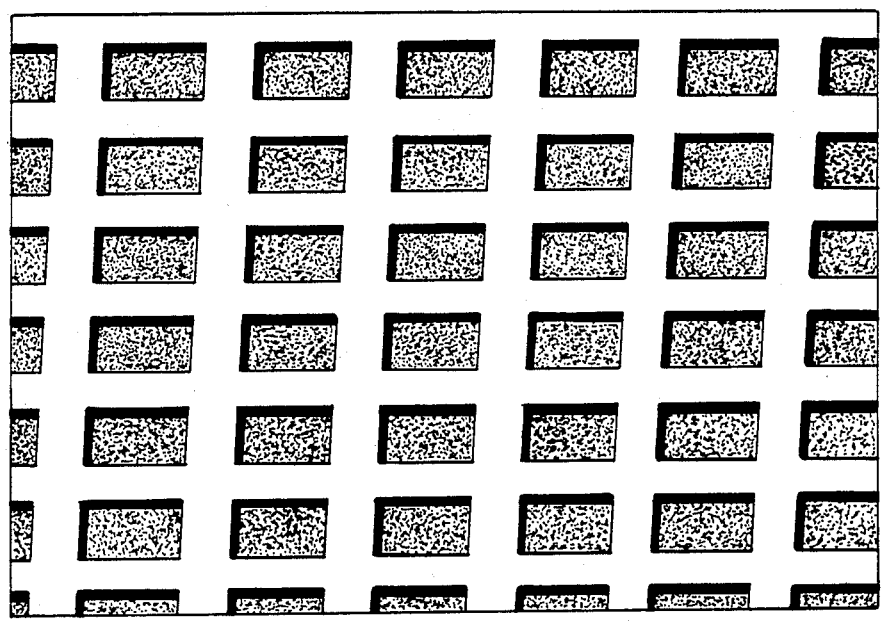
FIG. 8 shows the front surface of the metal mesh after the nickel deposition and the subsequent removal of an inner portion of the backing of the silicon wafer.
Figure 9:
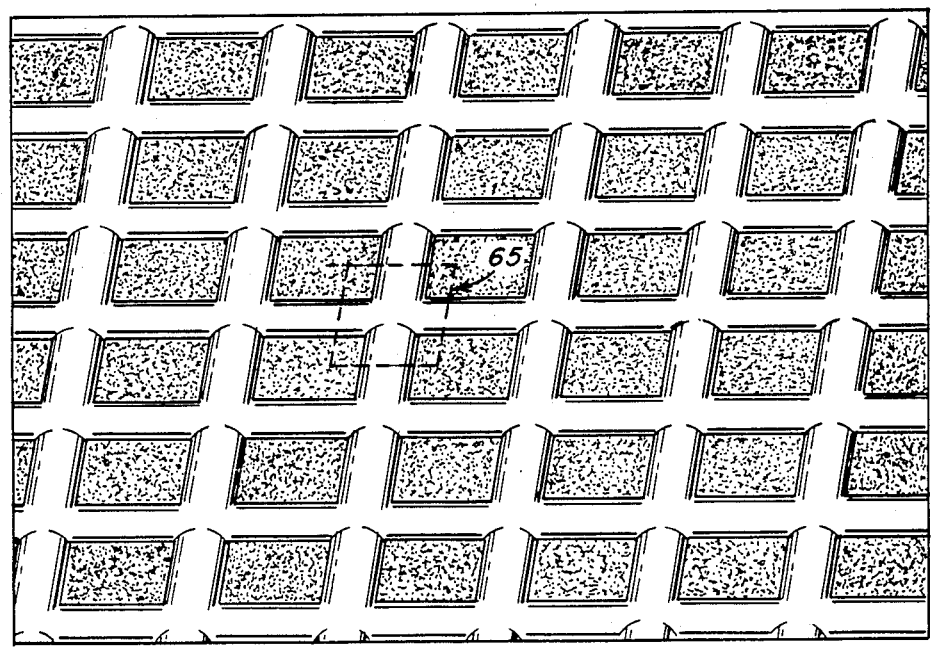
FIG. 9 shows the back surface of the metal mesh after the nickel deposition and the subsequent removal of the inner portion of the backing of the silicon wafer.

The completed Au-Ni-Au metal mesh 63 is illustrated in FIGS. 8, 9 and 9A.

FIG. 8 shows an enlarged view of the front surface of the completed free-standing Au-Ni-Au metal mesh 63 in a desired pattern. Note the flatness of the surface and the squareness of the corners in the metal mesh.

FIG. 9 shows an enlarged view of the back surface of the completed metal mesh 63. Note that the back surface has a little rounding to it, since it was not in contact with the silicon wafer 11. As a result, it does not have quite the squareness or smoothness of the front surface. But it is still very good, considering it is an enlargement of an exemplary grid pattern which had approximately 2,700,000 square holes in a 1.25 inch grid diameter pattern on a 2 inch wafer.

FIG. 9A shows in dashed lines an enlargement of part 65 of the back surface shown in FIG. 9.

Evaporating Chrome-Gold Onto The Front Surface

A thin strip of nickel remains exposed about the gold-nickel interface on the front surface. In an optional step, chrome and gold can be sequentially exaporated onto the front surface to completely cover this nickel.

The above-described process or fabrication method provides the following advantages:

1. The size, shape and spacing of the lines in the metal mesh grid pattern can be controlled by the photographic procedure (of exposing and developing the desired pattern 33 on the photoresist layer 31) and the plating procedures (of ultimately converting the resist pattern into a Au-Ni-Au metal mesh pattern).

2. The width of the lines in the metal mesh grid pattern can be controlled by the plating procedures and particularly in the step of plating the gold layer in the Cr-Au pattern with the nickel.

3. The sharp corners and edges (FIGS. 4, 5, 6, 8) in the metal mesh pattern were achieved by the proper selection of the photoresist 31 (that would have vertical sides 37 when developed), by the precise removal of the chrome and gold layers in the wash (FIG. 4), and by the proper plating of nickel.

4. The smooth surface on the front surface of the free-standing metal mesh pattern, as shown in FIG. 8, is produced by the smooth surface of the silicon 11 substrate on which the pattern was developed and by the clean up involved in the removal of the chrome layer 59 (FIG. 7).

5. Highly reflective surfaces at desired wavelengths can be achieved by the process.

6. The metal mesh grid pattern is supported by and prevented from being distorted during handling by the annular border around the metal mesh grid pattern.

Therefore, what has been described above is a method, which utilizes photographic and microelectronic techniques, for fabricating very flat and highly uniform, free-standing (or self-supporting) metallic meshes, which may be used in Fabry-Perot interferometers, as light or particle filters, as reflectors, as beam splitters, as optical polarizers, and in other like devices.

It should therefore readily be understood that many modifications and variations of the present invention are possible within the purview of the claimed invention. For example, any other suitable substrate with a smooth, flat surface could be used; any other suitable high-resolution lithographic printer could be used to develop a desired preselected pattern; the patterned membrane could be developed from different materials, from only one material, and/or by itself without a border encompassing it; and the patterned membrane and-/or the encompassing border (when utilized) could be developed with different sizes and configurations.

What is claimed as new and desired to be secured by letters patent of the United States is:

1. A method for fabricating a free-standing, thin membrance that has a smooth surface containing a desired pattern of holes extending through the thickness of the membrane, said method comprising the steps of:
    applying a photoresist material to the front side of a substrate;
    lithographically developing a preselected pattern in the photoresist material;
    depositing a first material into the preselected pattern to form an inner pattern within the preselected pattern;
    removing from the front side the photoresist material and any first material on that photoresist material to expose the inner pattern;
    depositing a second material onto the exposed portion of the first material to develop the desired pattern; and
    removing the substrate to produce the free-standing thin membrance having a smooth surface containing the desired pattern of holes extending through the thickness of the membrane.

2. A method for fabricating a free-standing, thin membrane that has a smooth surface containing a desired pattern of holes extending through the thickness of the membrane, said method comprising the steps of:
    applying a photoresist material to the front side of a substrate;
    lithographically developing a preselected pattern in the photoresist material;
    sequentially depositing first and second materials into the preselected pattern to form an inner pattern within the preselected pattern;
    removing from the front side the photoresist material and any first and second materials on that photoresist material to expose the inner pattern;
    depositing a third material onto exposed portions of the first and second materials to develop a widened inner pattern;

depositing a fourth material onto the third material to develop the desired pattern;

removing the substrate to expose the desired pattern; and removing the first material from the desired pattern to produce the desired, free-standing, thin membrane having a smooth surface containing the desired pattern of holes extending through the thickness of the membrane.

3. A method for fabricating a free-standing, thin membrane that has a smooth surface containing a desired pattern, said method comprising the steps of:

selectively depositing a first material on both front and back sides of a substrate having a smooth, flat surface;

removing a central portion of the first material on the back side of the substrate;

applying a photoresist material to the front side of the substrate;

lithographically developing in the photoresist material on the front side of the substrate a preselected pattern;

sequentially depositing second and third materials into the preselected pattern to form an inner pattern within the preselected pattern;

removing from the front side the photoresist material and any second and third materials on that photoresist material to expose the inner pattern;

depositing a fourth material onto the third material on the inner pattern to develop a widened inner pattern;

depositing the third material onto the fourth material on the widened inner pattern to develop the desired pattern;

sequentially removing central portions of the substrate and first material on the front side of the substrate to expose the desired pattern; and removing the second material from the desired pattern to produce the desired, free-standing, thin membrane.

4. A method for fabricating a self-supporting, thin-film, desired metallic mesh, said method comprising the steps of:

selectively depositing an oxide material on each of front and back sides of a silicon substrate;

removing a central portion of the oxide material on the back side of the substrate;

applying a photoresist layer to the front side of the substrate;

lithographically developing in the photoresist layer a preselected mesh pattern and a preselected border encompassing the preselected pattern;

sequentially depositing chrome and gold layers onto the preselected border and into the preselected mesh pattern to form an inner mesh pattern within the preselected mesh pattern;

removing from the front side any remaining portions of the photoresist layer and any chrome and gold on such remaining portions to expose the inner mesh pattern and preselected border;

depositing a nickel layer onto the gold layer to develop a widened inner mesh pattern;

depositing a second gold layer onto the nickel layer to form a desired mesh pattern;

sequentially removing central portions of the silicon substrate and oxide material on the front side of the substrate to expose the desired mesh pattern; and removing the chrome layer from the desired mesh pattern to produce the desired self-supporting metallic mesh.

5. A method for fabricating a free-standing, thin-film, metallic mesh having a smooth, flat surface containing a desired pattern, said method comprising the steps of:

selectively depositing silicon dioxide layers on the front and back sides of a silicon substrate, with the back side layer being thicker than the front side layer;

etching away a central portion of the back side layer of silicon dioxide;

applying a photoresist layer to the front side layer of silicon dioxide;

exposing the photoresist layer to a preselected mesh pattern;

lithographically developing the exposed photoresist layer to produce the preselected mesh pattern and a preselected border encompassing the preselected mesh pattern and disposed outside of the etched away central portion of the back side layer of silicon dioxide;

depositing a layer of chrome into the preselected mesh pattern and onto the preselected border;

depositing a layer of gold over the layer of chrome to form an inner pattern within the preselected mesh pattern;

removing the developed photoresist layer and any chrome and gold on undeveloped portions of the photoresist layer to expose the inner pattern;

electroplating the gold layer of the chrome-gold layers with a layer of nickel to increase the thickness and line width of the inner pattern of chrome-gold layers;

electroplating the nickel layer of the chrome-gold-nickel layers with a second layer of gold to form the desired pattern;

etching away that portion of the silicon substrate within the etched away central portion of the back side layer of silicon dioxide;

etching away the central portion of the front side layer of silicon dioxide to expose the desired metallic mesh; and etching away the chrome layer to produce the free-standing, thin-film, desired metallic mesh having a smooth, flat surface and containing the desired pattern.

* * * * *